(12) United States Patent
Heinzl et al.

(10) Patent No.: US 6,842,498 B2
(45) Date of Patent: Jan. 11, 2005

(54) GLOBAL POSITIONING SYSTEM INTERFERENCE DETECTION

(75) Inventors: Johann Heinzl, Los Altos, CA (US); Gary Jacobsen, San Jose, CA (US); Jining Yang, Sunnyvale, CA (US); Kishan Shenoi, Saratoga, CA (US)

(73) Assignee: Symmetricom, Inc., San Jose, CA (US)

( * ) Notice: Subject to any disclaimer, the term of this patent is extended or adjusted under 35 U.S.C. 154(b) by 120 days.

(21) Appl. No.: 10/294,227

(22) Filed: Nov. 14, 2002

(65) Prior Publication Data
US 2003/0112905 A1 Jun. 19, 2003

Related U.S. Application Data

(63) Continuation of application No. 09/802,484, filed on Mar. 9, 2001, now Pat. No. 6,512,803.
(60) Provisional application No. 60/194,798, filed on Apr. 5, 2000.

(51) Int. Cl.[7] .................................................. H04B 1/10
(52) U.S. Cl. ........................ 375/350; 455/63; 455/227; 455/278.1; 455/307
(58) Field of Search ................................. 375/216, 316, 375/343, 346, 450, 351, 255; 361/126, 131, 132; 455/63, 202, 226.2, 226.3, 227, 266, 271, 278.1, 296, 307; 708/300, 322

(56) References Cited

U.S. PATENT DOCUMENTS

| | | | |
|---|---|---|---|
| 5,268,927 A | 12/1993 | Dimos et al. ................... 375/1 |
| 5,375,146 A | 12/1994 | Chalmers ..................... 375/103 |
| 5,694,416 A | 12/1997 | Johnson ....................... 342/368 |
| 5,717,717 A | 2/1998 | Yang et al. .................. 375/232 |
| 5,872,540 A | 2/1999 | Casabona et al. ........... 342/362 |
| 5,930,310 A | 7/1999 | Freeman ...................... 329/318 |
| 6,115,409 A | 9/2000 | Upadhyay et al. .......... 370/487 |
| 6,118,499 A | 9/2000 | Fang ........................... 348/726 |
| 6,141,371 A | 10/2000 | Holmes et al. ............... 342/17 |
| 6,240,150 B1 | 5/2001 | Darveau et al. ............. 375/222 |

FOREIGN PATENT DOCUMENTS

EP   0 987 829 A2   3/2000

OTHER PUBLICATIONS

"Eleventh International Technical Meeting of the Satellite Division of the Institute of Navigation," ION–GPS 1998, CD–ROM.

(List continued on next page.)

*Primary Examiner*—Dac V. Ha
(74) *Attorney, Agent, or Firm*—John Bruckner PC

(57) ABSTRACT

Systems and methods are described for a GPS receiver capable of functioning in the presence of interference. A method includes detecting an interfering signal including: tuning a band pass filter over a frequency range; and at each of a plurality of incremental frequencies: computing a set of band pass filter coefficients; sending the set of band pass filter coefficients to a digital filter; repeatedly transforming an analog-to-digital converter output having a quantization level in excess of 2 bits into a band pass filter output with the digital filter to obtain a plurality of samples; computing an average of the plurality of samples; and comparing the average to a threshold to detect peaks that exceed a threshold. An apparatus includes: an analog radio frequency circuit; an analog-to-digital converter coupled to the analog radio frequency circuit, the analog-to-digital converter providing a quantization level in excess of 2 bits; a digital filter coupled to the analog-to-digital converter; and a digital circuit coupled to the digital filter.

27 Claims, 7 Drawing Sheets

OTHER PUBLICATIONS

"Navigation 2000," Proceeds of the National Technical Meeting of the Institute of Navigation, 1998.

Fante, et al., "Enhanced Anti–Jam Capacity for GPS Receivers," The MITRE Corporation, Bedford, MA 01730, 251–254.

Lopez–Almansa, et al., "Measurement Error and Protection Envelopes in the Presence of Interference for GNSS Receivers," TTC & RF Navigation Section, European Space Agency ESA–ESTEC (The Netherlands), 797–807.

Lyusin, et al., "Combined GPS/GLONASS Receiver with High Antijamming Performance," Magellan Corp. Moscow Development Center, 775–782.

Moulin, et al., "High–Performance RF–to–Digital Translators for GPS Anti–Jam Applications," the MITRE Corporation, 233–239.

Zhodzishsky, et al., "In–Band Interference Suppression for GPS/GLONASS," Javad Positioning Systems, 769–773.

US 6,842,498 B2

GLOBAL POSITIONING SYSTEM INTERFERENCE DETECTION

CROSS-REFERENCE TO RELATED APPLICATION

This application is a continuation of, and claims the benefit of 35 U.S.C. 120 of the filing date of, U.S. patent application Ser. No. 09/802,484 by inventors Johann Heinzl, Gary Jacobsen, Jining Yang and Kishan Shenol entitled "Global Positioning System Receiver Capable of Functioning in the Presence of Interference" filed on Mar. 9, 2001, now U.S. Pat. No. 6,512,803 which in turn is a continuation-in-part of, and claims a benefit of priority under 35 U.S.C. 119(e) of U.S. Ser. No. 60/194,798 filed on Apr. 5, 2000, the entire contents of which are hereby expressly incorporated by reference for all purposes.

BACKGROUND OF THE INVENTION

1. Field of the Invention

The invention relates generally to the field of global positioning system (GPS) receivers. More particularly, the invention relates to a GPS receiver capable of functioning in the presence of interference such as continuous wave (CW) jamming. The invention thus relates to a GPS receiver of the type that can be termed CW jamming robust.

2. Discussion of the Related Art

GPS receivers are most often considered as tools for location or navigation. However, GPS receivers can also be used to provide time. In particular, the GPS constellation is monitored and controlled by the Department of Defense so that a GPS receiver can be used to extract time traceable to the US Naval Observatory (USNO) which in turn tracks UTC (Universal Coordinated Time) that is maintained in Paris as the international time standard. Consequently a GPS receiver can be used to discipline a local oscillator to provide accurate frequency and can be used to provide a time signal that tracks UTC. We refer to time extracted in such a manner as "GPS time."

Symmetricom Inc. (San Jose, Calif.) provides a series of products based on GPS for providing accurate time and frequency. For example, Symmetricom products are used by telephone companies to provide accurate timing (frequency) signals. Wireless telephone operators that deploy CDMA (code divisional multiple access) cellular telephony are familiar with Symmetricom timing units that are installed in the base station to provide accurate frequency as well as accurate time, embodied, for example, in a signal designated as 1-PPS (for one pulse per second). In practice the interval between pulses can be something other than 1 second, but the pulse position is related in an absolute sense to GPS time. For example, CDMA base stations often require a pulse corresponding to every even second of GPS time.

When a receiver is deployed, there is often little flexibility as to where the antenna may be mounted. In the case of a cellular base station, the GPS antenna is mounted in reasonable proximity to the cellular antenna. Now the signal level received at the antenna from the GPS satellites is extremely small, of the order of −130 dBm ($10^{-10}$ milliwatt) and thus the GPS receiver is quite susceptible to interfering signals. The nominal bandwidth (one-sided) of the GPS spectrum is 1.1 MHz centered at the RF carrier which is transmitted at the L1 frequency (1.57542 GHz). An interfering signal outside this band can, in principle, be removed by the filters that delineate the GPS band, either at the L1 frequency itself or in combination with filters at a suitable intermediate frequency (IF). Using (analog) filters in this manner to reduce the impact of interfering signals is well known.

There have been some techniques proposed to date that have addressed the problem of interfering signals that lie within the GPS bandwidth. References [6 through 9] address methods proposed for improved performance in the presence of jamming CW interference. The jamming signal could well be inband. Generally speaking, these methods address the mitigation of the impact of the jamming signal on the delay-locked-loop used for code tracking.

One approach is to use an increased number of bits in the ADC (A/D converter) and rely on the correlation process to mitigate the impact of the jammer. This approach is based on the premise that the correlator will distinguish between the Gold code and a CW (tone), which indeed it does, provided that the power level of the jammer is not so large as to send the ADC into a saturation mode. By increasing the dynamic range of the ADC (with the concurrent increase in number of bits) one would expect jamming immunity.

A second approach that has been proposed is to use an antenna array and develop a synthetic antenna pattern that has a null in the direction from which the CW signal is being received. This method is quite complex and expensive.

A third approach is indicated in Ref [7]. The method described therein is one of "cancellation" rather than "removal." That is, a "replica" (or as close to a replica as is feasible) of the jamming signal is generated and is subtracted from the received signal. This cancellation method is of value when the jamming signal is indeed a very narrow-band CW signal, essentially a pure tone. For wider applicability, multiple CW "replicas" can be generated and subtracted in the event that there are more than one jamming signals. This method has a severe drawback in the sense that if the replica generated is not indeed identical and 180-degrees out-of-phase from the jamming signal, one could actually be adding interference.

SUMMARY OF THE INVENTION

There is a need for the following embodiments. Of course, the invention is not limited to these embodiments.

One embodiment of the invention is based on a method, comprising: detecting an interfering signal including: tuning a band pass filter over a frequency range; and at each of a plurality of incremental frequencies: computing a set of band pass filter coefficients; sending said set of band pass filter coefficients to a digital filter; repeatedly transforming an analog-to-digital converter output having a quantization level in excess of 2 bits into a band pass filter output with said digital filter to obtain a plurality of samples; computing an average of said plurality of samples; and comparing said average to a threshold to detect peaks that exceed a threshold. Another embodiment of the invention is based on an apparatus, comprising: an analog radio frequency circuit; an analog-to-digital converter coupled to said analog radio frequency circuit, said analog-to-digital converter providing a quantization level in excess of 2 bits; a digital filter coupled to said analog-to-digital converter; and a digital circuit coupled to said digital filter. Another embodiment of the invention is based on an electronic media, comprising: a computer program having a sequence of instructions for detecting an interfering signal including: tuning a band pass filter over a frequency range; and at each of a plurality of incremental frequencies: computing a set of band pass filter coefficients; sending said set of band pass filter coefficients to a digital filter; repeatedly transforming an analog-todigital converter output having a quantization level in excess of 2 bits into a band pass filter output with said digital filter to obtain a plurality of samples; computing an average of said plurality of samples; and comparing said average to a threshold to detect peaks that exceed a threshold. Another embodiment of the invention is based on a computer program, comprising: computer program means adapted to perform the steps of detecting an interfering signal including: tuning a band pass filter over a frequency range; and at each of a plurality of incremental frequencies: computing a set of band pass filter coefficients; sending said set of band pass filter coefficients to a digital filter; repeatedly transforming an analog-to-digital converter output having a quantization level in excess of 2 bits into a band pass filter output with said digital filter to obtain a plurality of samples; computing an average of said plurality of samples; and comparing said average to a threshold to detect peaks that exceed a threshold when said program is run on a computer.

The embodiments described above relate to the detection of an interfering signal. It is easily shown that by using a notch filter instead of a band pass filter, the interfering (CW) signal can be removed, thereby minimizing the impact of the interfering signal on the performance of the GPS receiver. Furthermore, the structure of the notch filter and structure of the band pass filter are closely related so that computing a set of notch filter coefficients based on a set of band pass filter coefficients, and vice versa, is quite straightforward.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same elements. The invention may be better understood by reference to one or more of these drawings in combination with the description presented herein. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this detailed description.

Within this application several publications are referenced by Arabic numerals within brackets. Full citations for these, and other, publications may be found at the end of the specification immediately preceding the claims after the section heading References. The disclosures of all these publications in their entireties are hereby expressly incorporated by reference herein for the purpose of indicating the background of the invention and illustrating the state of the art.

The below-referenced U.S. Patent(s), and U.S. Patent Application(s) disclose embodiments that were satisfactory for the purposes for which they are intended. The entire contents of U.S. patent application Ser. No. 60/194,798, filed Apr. 5, 2000 are hereby expressly incorporated by reference herein for all purposes.

Our method uses digital filters to remove the jamming signal. It is quite robust in the sense that the nature of the jamming signal is not constrained and there is just a small penalty paid if we try to "remove" a jamming signal that is not indeed present.

General Background

The GPS signal has two distinct components. These are often considered in terms of the coding scheme and availability. The "P-code" signal was designed for military applications and is not generally available for use by common (commercial) receivers. The "C/A-code" is available for general use. Commercial GPS receivers are universally based on the C/A-code and the "P-code" signal appears as "noise." In this discussion we shall concentrate on the C/A version exclusively.

The signal transmitted by a GPS satellite comprises a Gold code with superimposed data. The base-band signal is modulated onto the RF carrier at the L1 frequency (1.57542 GHz). The chip rate of the Gold code (C/A code) is 1.023 Mchips/sec and the period of the Gold code is 1023 chips. Thus, the period of the Gold code is 1 msec. The underlying data rate is 50 bps (20 msec per data-bit). That is, each data-bit is transmitted over 20 periods of the Gold code.

Figure 1:
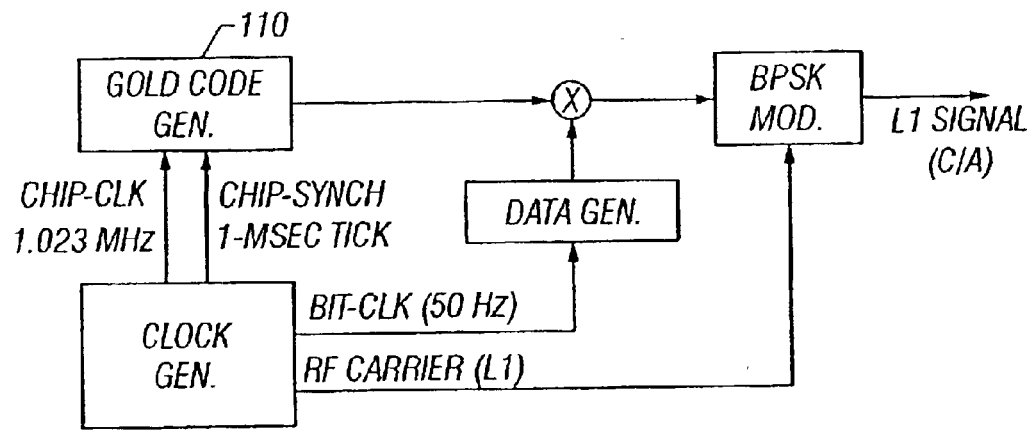
FIG. 1 illustrates a schematic block diagram of conventional GPS signal generation, appropriately labeled "Prior Art."

A rudimentary block diagram of the GPS signal generation is depicted in FIG. 1. The Gold code generator 110, where each SV (Satellite Vehicle) is assigned a unique Gold code, provides the periodic signal of 1023 chips at the chip rate of 1.023 Mchips/sec. This can be viewed as a two-level signal (binary valued) with the two values logically equivalent to a "Digital-0" and "Digital-1" (or Logic-0 and Logic-1). The binary data at 50 bps is modulated on the Gold code. The action is simple in that a data-bit of "1" inverts the Gold code whereas a data-bit of "0" does not (obviously the role of "1" and "0" for the data-bits can be reversed with no loss of generality) and this is equivalent to an EXCLUSIVE-OR (EXOR) logic operation. This composite signal (which is the "base-band" signal) is modulated onto the RF carrier for transmission. In the satellite, the data, chip, and carrier are phase and frequency synchronous. That is, the data signal changes at a chip boundary; the chip boundary coincides with a zero-crossing of the carrier; and all timing signals (data-bit-clock, chip-clock, and carrier-frequency) are derived from the same source.

Furthermore, the actual data is formatted into "words," "sub-frames," and "frames." Each "word" comprises 30 bits (600 msec); each "subframe" consists of 10 words (300 bits, 6 sec.); each frame of 5 subframes or 1500 bits (50 words, 1500 bits, 30 sec.).

The notion of "acquiring GPS" has multiple connotations. At the lowest level is "code-phase acquisition" wherein the receiver has established the "start-of-code" (the 1-msec period) for the SV being acquired (tracked). The receiver can be considered to be in "chip-synch" with the SV. Chip-synch is necessary in order to achieve "data-bitsynch," considered next. "Data-bit-synch" wherein the receiver has identified the start of a data-bit-period (which is 20 msec). Data-bit-synch is important for demodulating the data. The data pattern is examined to establish "frame-synch." Frame-synch is necessary for interpretation of the data.

Figure 2:
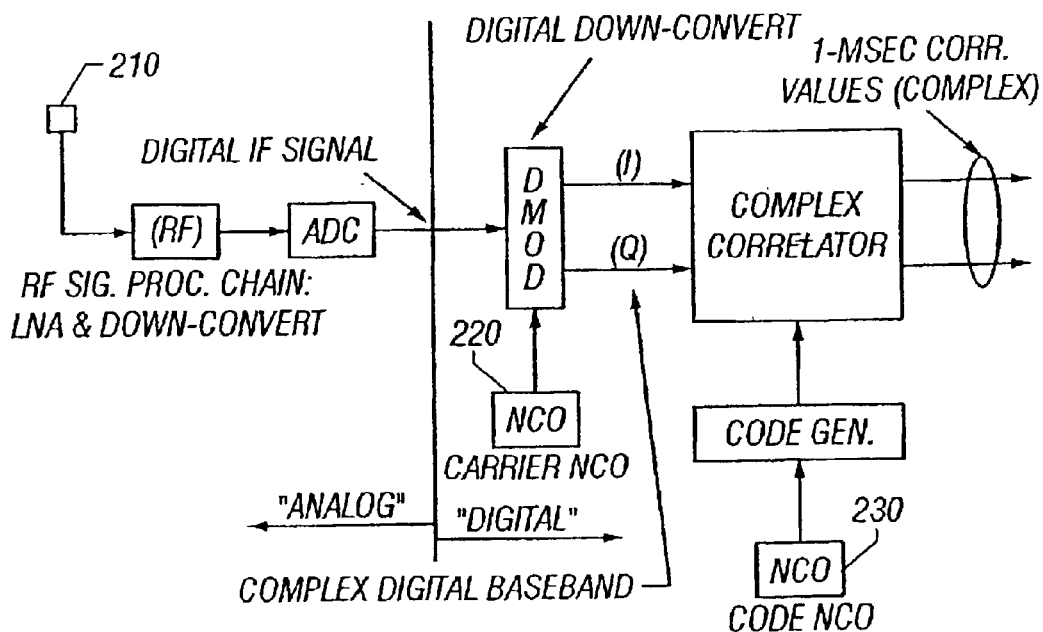
FIG. 2 illustrates a schematic block diagram of the fundamental features of a conventional GPS receiver, appropriately labeled "Prior Art."

Gold codes have good auto-correlation and cross-correlation properties. This behavior is one of the reasons Gold codes were chosen as the foundation of the GPS signal structure. The correlation properties of Gold codes dictate the structure of the GPS receiver, the underlying principle of which is depicted in FIG. 2. The incoming RF signal from the antenna 210 is down-converted to base-band to provide the "I" (in-phase) and "Q" (quadrature) components. A correlation operation is performed (on both I and Q components) by multiplying the incoming (base-band version) signal by a replica of the appropriate Gold code and integrating. The integration is performed over 1-msec intervals (the period of the Gold code). The magnitude of this (complex, i.e., I and Q) correlation is indicative of the presence or absence of the chosen Gold code in the received signal. In particular, if the chosen Gold code is absent from the received signal, the correlation value will always be small (i.e., the SV that uses this Gold code is not visible). If the chosen Gold code is present (i.e., the SV is visible) and the replica generated locally is phase-aligned with Gold code in the received signal, then the correlation (magnitude) value will be high.

In a GPS receiver, several such correlators operate in parallel, each using a different Gold code. That is, multiple satellites can be viewed simultaneously. In practice, one must take into account the fact that the SV and the receiving antenna are moving relative to one another. The satellites orbit the earth every 12 hours and the receiving antenna, which can be viewed as a point on the earth's surface, is completing one rotation every 24 hours. Thus, a given satellite is not always in view and, further, when in view is moving from one horizon to the opposite horizon. This movement introduces a Doppler shift that is manifest in terms of a shift in carrier frequency as well as a shift in code frequency. Further, this Doppler effect is not constant but changes with relative position of the SV with respect to the receiver antenna.

To account for this apparent "drift" a GPS receiver takes the form depicted in FIG. 2. The effective carrier frequency is "adjusted" using an NCO 220 and the effective chip-rate is adjusted using an NCO 230 as well.

Figure 3:
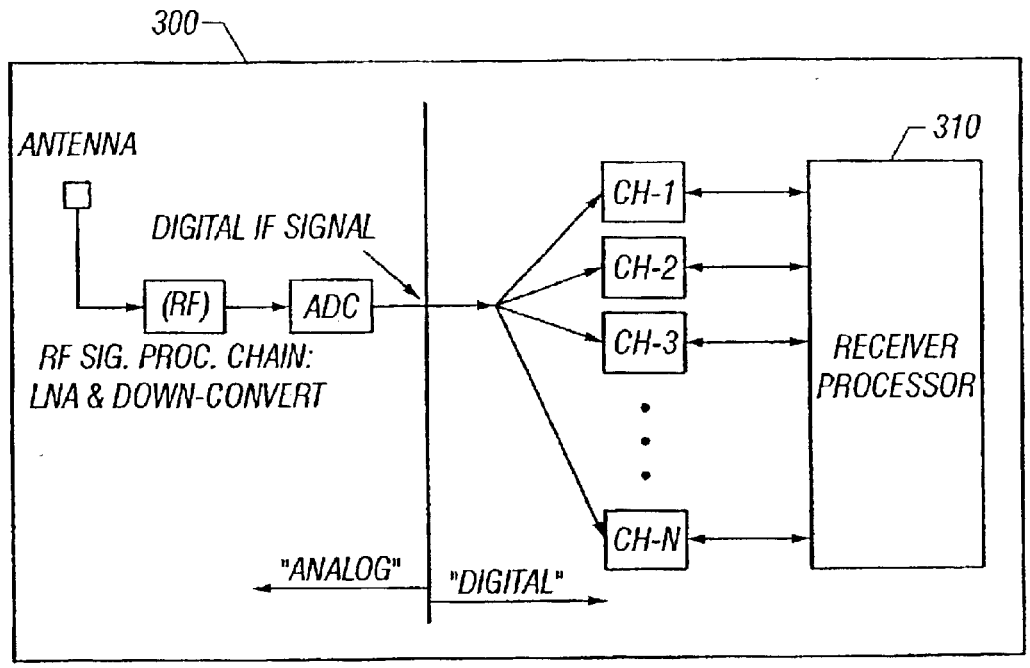
FIG. 3 illustrates a schematic generic block diagram of a conventional GPS receiver architecture, appropriately labeled "Prior Art."

In a GPS receiver 300 the assembly of NCOs and correlator is often called a "channel" and with this terminology a "12-channel" receiver will have 12 parallel assemblies of the form shown in FIG. 3 where a generic block diagram of a GPS receiver is depicted. The correlators provide one (complex) correlation value every millisecond. A processor unit 310 reads these correlation values to extract the GPS data (if present); the processor 310 also controls the NCOs for adjusting carrier and code rates and also controls the "code-phase." The code-phase is simply the notion of the start of the code (the first chip of the 1023 that comprise one period). Each satellite is at a different distance from the receiver antenna and thus the arrival of the first chip of the Gold code from the different satellites will be different. The processor 310 controls the code generators of the different channels to keep the local replica of the code aligned with the received code and this action is equivalent to controlling the code-phase for that channel.

Figure 4:
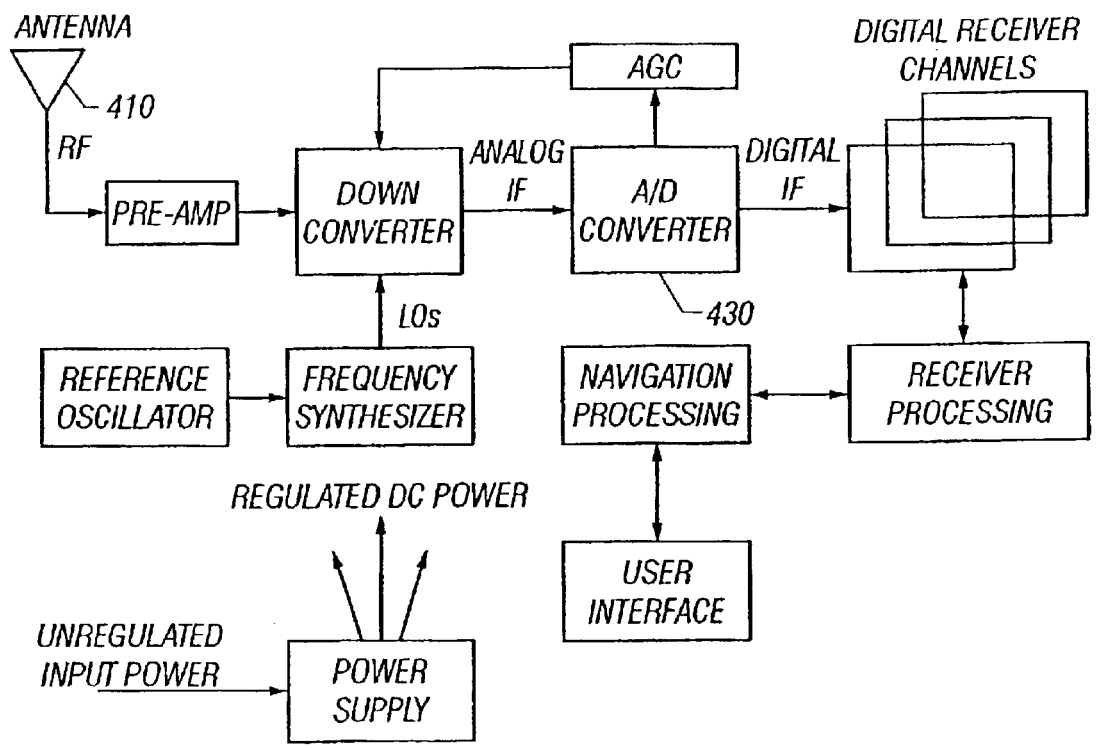
FIG. 4 illustrates a schematic block diagram of a generic GPS receiver, appropriately labeled "Prior Art."

Several chip-sets for implementing GPS receivers are available. All such chip-sets follow the rudimentary schematic depicted in FIG. 4. The signal from an antenna 410 is amplified using a low noise amplifier (LNA) and down-converted to a suitable intermediate frequency (IF). The signal is then converted into a digital format using a suitable sampling rate and wordlength (i.e., using an A/D converter 430). All available chip-sets assume a very coarse quantization, typically 1-bit (2 levels) or 2-bits (four levels) or 1.5-bits (3 levels). After conversion, the effective IF (i.e., down-converted carrier frequency) is typically (approximately) one quarter the sampling frequency with a small offset. This down-conversion and A/D conversion is often achieved in the "analog chip" of the chip-set. The digital signal comprising the sampled and quantized GPS signal (at IF) is fed to the "digital chip" of the chip-set. The subsequent down-conversions, correlations, etc. are performed using hardware in the digital-chip. The digital chip also includes a processing element (i.e., a programmable micro-processor) for performing the computations related to acquisition, tracking, data-demodulation, navigation, etc., associated with a GPS receiver. In some implementations the "digital-chip" is split into the GPS specific part and a general-purpose processor, usually of the RISC type.

Whereas the discussion here is applicable in principle to all chip-sets, for specificity we shall assume we are using the readily commercially available chip-set from Mitel Semiconductor Inc. (see Ref [2]).

Methods for Acquiring GPS

The underlying principle of GPS signal acquisition is the notion of correlation. Consider the situation where the "signal" is a particular Gold code, $\{g(k); k=0,1, \ldots, 1022\}$, sent continually. Assume that the down-conversion has translated the GPS signal from L1 frequency down to base-band and that we have taken (complex) samples at the chip rate (1.023 MHz). The sampled (complex) signal can be written as $$w(k) = \alpha \cdot g(k-M) + s(k) \qquad (2.1.1)$$

where $s(k)$ is the noise component (from a variety of sources), and $\alpha$ is a complex number representative of the amplitude and phase of the "signal" component (a phase angle can be introduced because the phase of the equivalent local oscillator is not the same as the equivalent carrier). We assume that the sample index, k, is based on some reference in the receiver and the incoming Gold code "start-of-code" is offset from this time reference by M chips. The signal power is thus $|\alpha|^2$. Assuming the noise power is $\sigma^2$, the raw signal-to-noise ratio (SNR) is given by $$SNR = 20 \cdot \log_{10}\left(\frac{|\alpha|}{\sigma}\right) \text{dB} \qquad (2.1.2)$$

At the receiver we can generate a replica of the Gold code with a (programmable, under processor control) offset, say $\{g(k-K)\}$. This locally generated signal is correlated with the incoming signal in "chunks" of N=1023 samples (the period of the Gold code), or essentially we generate 1-msec samples of the correlation between the local replica and the incoming signal. This operation can be written as (with the index n representing samples taken at 1 kHz rate which is 1 msec intervals)

$$x(n) = \sum_{k=(n-1)N}^{k=nN-1} g(k-K) \cdot w(k) \qquad (2.1.3)$$

$$= \sum_{k=(n-1)N}^{k=nN-1} g(k-K) \cdot (\alpha \cdot g(k-M) + s(k))$$

$$= \alpha \cdot R_{gg}(K-M) + \sum_{k=(n-1)N}^{k=nN-1} g(k-K) \cdot s(k)$$

where $R_{gg}(k)$ is the autocorrelation function of the Gold code. The autocorrelation function of the Gold code exhibits a peak (of value N) at zero lag and is small elsewhere. Thus, if the Gold code is present, and we have chosen the offset of the local replica appropriately (i.e., when K=M), the correlation samples $\{x(n)\}$ will exhibit a large "dc" value equal to $N\alpha$. The two components of $x(n)$ can be viewed as "signal" (the first part) and "noise" (the second part). Assuming that the additive noise $\{s(k)\}$ is white noise, then the variance (i.e., power) of the noise component of $\{x(n)\}$ is $N\sigma^2$. The power of the signal component is $N^2\alpha^2$. The post-correlation SNR is thus given by $$SNR = 20 \cdot \log_{10}\left(\frac{|\alpha|}{\sigma}\right) + 10 \cdot \log_{10}(N) \text{dB} \qquad (2.1.4)$$

Correlation has thus provided an increase in SNR of roughly 30 dB provided that the controlled offset, K, is equal to the actual offset, M. Thus, even if the raw SNR is "small," so small that presence of the Gold code signal is buried in the noise and may not be discernible by a simple observation of the sample values, the correlation operation makes detection viable. In GPS literature the signal-to-noise ratio is often considered in terms of "C over N" or "C/N" where the noise power is considered in a 1 Hz bandwidth. The post-correlation SNR, considering the implied sampling rate is 1 kHz, is roughly 30 dB smaller than the "C/N" number. Typical values for the C/N number, assuming the antenna is roof-top mounted and has a clear, unobstructed, view of the sky (and hence the satellites) are in the 40 to 45 dB range for satellites that are roughly overhead.

The received signal will contain components from all the visible satellites. However, each satellite uses a different Gold code and Gold codes have the nice property that the cross-correlation between different Gold codes, for any offset, is small, typically (N/10), worst-case, and thus the correlation process suppresses signals from satellites other than the one whose Gold code replica is being employed by the correlator.

The notion of "code-phase acquisition" is equivalent to establishing the correct offset M. The conventional method for acquiring code-phase involves searching over all 1023 possible values for K. That is, if we are searching for a particular satellite identified with a particular Gold code, $\{g(k)\}$, we compute the strength, $X(K)$, of the correlation of this Gold code with the input signal $\{w(k)\}$ for various values of offset, K, and compare this value with a threshold, T. If $X(K) > T$ for some value of K, we declare acquisition of code-phase; if $X(K) < T$ for all 1023 values of K, then we declare that we cannot acquire code-phase for that satellite at that time.

To establish the threshold, T, we compute the strength of the correlation (at some arbitrary offset), say Y, of the received input signal using a Gold code that does not correspond to any satellite in the GPS constellation, say $\{h(k)\}$, and set the threshold to be somewhat greater than Y. Since we are dealing with signals that are noise-like, or random, in nature, the estimate of strength is obtained by averaging over a suitable number of milliseconds, say L. That is, $$Y = \frac{1}{L} \sum_{n=0}^{n=(L-1)} \left| \sum_{k=(n-1)N}^{k=nN-1} h(k-K_1) \cdot w(k) \right|^2 \qquad (2.1.5)$$

$T = A \cdot Y \{A \text{ is typically 2 or 3}\}$ $$X(K) = \frac{1}{L} \sum_{n=0}^{n=(L-1)} \left| \sum_{k=(n-1)N}^{k=nN-1} g(k-K) \cdot w(k) \right|^2$$

compare $X(K) \geq T$

In practice there could be another unknown, namely the Doppler shift (or sum of the actual Doppler and the frequency "error" of the local oscillator). Consequently we do this search process for all values of K over a grid of Doppler shifts. The local oscillator can be of high quality and the range of Doppler shifts to account for the frequency bias error of the local oscillator can be small. The choice of L is typically 4 to 10. Using larger values of L reduces the variability of the strength estimate but has the drawback of increasing the search (and thus acquisition) time. Also, L cannot be made indefinitely large since the Doppler shift could change over the (long) interval, in which case the averaging to reduce variability is contraindicated.

The signal-to-noise ratio influences our ability to detect the presence of the Gold code and thus our ability to acquire code-phase-synch. In particular, we can show that $$Y \approx N\sigma^2$$
$$X(M) \approx N^2 \cdot |\alpha|^2 + N\sigma^2 \quad (2.1.6)$$
$$\frac{X(M)}{Y} \approx 1 + \frac{N \cdot |\alpha|^2}{\sigma^2}$$

Assuming that the factor, A, used to determine the threshold is about 3, then the post-correlation SNR needs to be above 3 dB corresponding to a "C/N" number of about 33 dB. In practice there are also other factors that come into play and as a consequence of which the "C/N" number for reliable detection (using the conventional scheme described above) is somewhat greater than 33 and is closer to 36 or 37. These other factors include non-ideal behavior of components such as band-pass filters in the analog front-end, the A/D converter, down-conversion mixers, amplifier noise, and so on, all of which tend to reduce the correlation peak (relative to the noise floor).

The Code Tracking Loop

The notion of acquiring code-phase is to establish a starting point for determining the start of the code in the received signal. The function of the Code-Tracking Loop is to automate the mechanism of "holding-on" to this condition. Because of the motion of the satellites relative to the receiver, the effective distance between the receiver and the satellite is continuously changing and hence the code-phase (i.e., apparent start of code relative to some reference time in the receiver) is not constant. The Code-Tracking Loop functions to continuously adjust the local code-phase so that there is match between local code replica and incoming Gold code from the satellite. This topic is not discussed in detail here except to mention the "discriminator" used to assess how much the local code-phase should be altered so as to keep in alignment with the received Gold code.

So far the notion of acquisition was tied to finding the code-phase for which the correlation (power) was maximized. This code-phase is referred to as the "prompt." The function of the Code Tracking Loop is to maintain the code-phase such that the prompt correlation is (always) maximized. To do this, correlation is also evaluated at a code-phase corresponding to a half-chip prior, or "early," and a half-chip delayed, or "late." If the receiver is indeed tracking the incoming Gold code, then the correlation value for "prompt" should be larger than the correlation values for either "early" or "late." Furthermore, if the receiver is indeed in alignment with the incoming Gold code, then, under ideal conditions, the correlation value for early and late will be equal. If they are not equal, then the difference provides an "error signal" suitable for controlling the NCO associated with the Code Generator. The control signal derived from the difference (i.e., the "error") thus modifies the code-phase such that the "early" equals "late" condition is satisfied. We still need to ensure that the prompt correlation value is still large and is larger than "early" as well as "late."

Denoting by $I_p$, $I_e$, and $I_L$ the real part of the correlation values for "prompt," "early" and "late," and by $Q_p$, $Q_e$, and $Q_L$ the corresponding imaginary parts, the following "discriminator" is suggested:

$$\Delta = \frac{(I_e - I_L) + j(Q_e - Q_L)}{I_p + jQ_p} \quad (2.2.1)$$
$$= \frac{(I_e - I_L) \cdot I_p + (Q_e - Q_L) \cdot Q_p}{I_p^2 + Q_p^2} +$$
$$j - (I_e - I_L) \cdot Q_p + \frac{(Q_e - Q_L) \cdot I_p}{I_p^2 + Q_p^2}$$

It can be shown that when good code-lock is achieved, the discriminator is zero (or close to zero). Further, it can be shown that the real-part of the right hand side of Eq. (2.2.1Δ is often adequate for generating a control signal for adjusting the code-loop NCO.

Some comments regarding the discriminator are in order. First, if we can assume that the effective frequency response between the transmitter (satellite) and the receiver (correlator) can be modeled as an "ideal" filter, one whose magnitude response is flat and phase response is linear-phase over the bandwidth of the principal signal, then the cross-correlation between the local Gold code replica and the received signal is equivalent to the auto-correlation of the Gold code itself, scaled by "α" which takes into account the sign of the data-bit, the flat gain of the transmission medium, including any filters in the down-conversion process. Of course there may be an additive noise term as well. This is depicted in Eq. (2.1.3). Then if we are in code-phase alignment, we can write $$I_p + jQ_p = \alpha \cdot R_{gg}(0) + \gamma_p$$
$$I_e + jQ_e = \alpha \cdot R_{gg}(-\tau) + \gamma_e$$
$$I_L + jQ_L = \alpha \cdot R_{gg}(+\tau) + \gamma_L \quad (2.2.2)$$

In Eq. (2.2.2) the noise terms are referred to by "γ" The time quantity "τ" in the equation refers to the implied delay between the correlation phases. Typically τ is equal to one-half chip but we could choose any fraction of a chip between 0 and 1. Because the autocorrelation function is symmetric, and if we can ignore the noise component, we can see that when we are in code-phase alignment that the discriminant, Δ, will be zero. If we are not in code-phase alignment, and we have an offset, say, ε, then the prompt, early, and late correlation values are given by $$I_p + jQ_p = \alpha \cdot R_{gg}(\epsilon) + \gamma_p$$
$$I_e + jQ_e = \alpha \cdot R_{gg}(-\tau + \epsilon) + \gamma_e$$
$$I_L + jQ_L = \alpha \cdot R_{gg}(+\tau + \epsilon) + \gamma_L \quad (2.2.3)$$

and, again assuming that the noise terms are negligible, the discriminant Δ is not zero. Since the autocorrelation function, $R_{gg}(\tau)$, is symmetric, the imaginary part of Δ will be principally noise and the real part will be monotonically related to the offset, ε, and thus can be used to generate the control signal for the code NCO.

If the transmission path cannot be modeled as an "ideal" filter, then the correlation between the received signal and the local Gold code replica is no longer related to the autocorrelation function, $R_{gg}(\tau)$, but must be modified to account for the effective transfer function of the (entire) transmission medium between the transmitter and the correlator (receiver). Denote this by $R_{gg}'(\tau)$. Then Eq. (2.2.3) gets modified to $$I_p + jQ_p = \alpha \cdot R_{gg'}(\epsilon) + \gamma_p$$

$$I_e + jQ_e = \alpha \cdot R_{gg'}(-\tau + \epsilon) + \gamma_e$$

$$I_L + jQ_L = \alpha \cdot R_{gg'}(+\tau + \epsilon) + \gamma_L \quad (2.2.4)$$

Since the cross-correlation function $R_{gg'}(\tau)$ is not necessarily symmetric, then the discriminant $\Delta$ is not zero when we are in perfect code-phase alignment and, further, is zero when we are offset by some amount, $\eta$. The impact on the code tracking loop is to settle in at an offset which is between 0 and $\eta$.

Impact of Interference

The analysis provided here assumes that any signal component present in the GPS band can effectively be modeled as additive white noise. If there is a strong interfering component which is coherent, such as a tone, then the analysis is not quite applicable anymore. Whereas it is true that the action of correlation of input with the code tends to suppress all signals that are of a form other than the Gold code in question, this suppression is not perfect. An attenuation of interference relative to the expected Gold code is large but often not enough. Even if we assume that the correlation process introduces a 30 dB discrimination between Gold code and any other signal, an interfering signal of just −100 dBm would provide a post-correlation level comparable with that of the Gold code (assuming a −130 dBm GPS signal level).

Now consider a tone jammer at a frequency outside the GPS spectral region. The (analog) filters associated with the RF down-conversion chain would have to attenuate this signal to a level well below −100 dBm. When the interference is additive white noise, integrating over longer intervals helps to improve the post-correlation SNR. In the case of coherent jammers, unfortunately, this "nice" property of longer integration intervals does not hold. Integrating over one code period provides the (bulk of the) SNR improvement and extending the integration over multiple code periods provides little improvement.

When the tone jammer is "in-band" then the analog filters associated with the RF down-conversion provide no benefit. The only "defense" is the action of the correlator, and that provides just about 30 dB of SNR improvement. Furthermore, this improvement is achievable only if the analog-to-digital converter (ADC) does not introduce significant overload-related components. Early GPS receivers used a 1-bit ADC, essentially providing as the digital word just the polarity of the analog signal being converted. This coarse quantization introduces a lot of conversion noise but, provided the analog signal is representative of just GPS signal and additive white noise, the ADC noise is reasonably white and thus "suppressed" by the action of the correlator (30 dB SNR improvement for each code period). Investigations have indicated that if the sole defense against jamming is the SNR improvement afforded by the correlator, then there is an improvement in performance if the ADC wordlength is increased.

From the viewpoint of complexity of the digital implementation of the correlator, most chip-sets assume that ADC output wordlength is very limited, typically 1 (2-level) or 1.5 (3-level) or 2 (4-level) bits wide. Clearly, the smaller we make the word-length, the more beneficial it is from the viewpoint of circuit complexity, albeit at the expense of receiver performance. In Ref. [3] a 2-bit adaptive scheme is analyzed and found to be "adequate." The MITEL chip-set uses just such a conversion scheme to convert from analog to digital format. However, there is a limit to jamming immunity afforded by these "conventional" methods. Field experience has indicated that this level of immunity is inadequate. In particular, complaints of GPS receivers "losing lock," "going in and out of lock condition," and other such (similar sounding) complaints were received regarding GPS receivers deployed in a variety of locations. In most such cases, when faulty circuitry was eliminated as the root cause, the reason for such anomalous behavior was traced to the presence of strong CW interference.

The Anti-jamming Principle and Method

The methodology developed and described herein for combating the deleterious impact of CW jamming can be partitioned into four components. First is the notion of detection. Namely, the scheme provides for detecting the presence of a potential jammer. Second is the elimination, or significant attenuation, of this jamming component while preserving the bulk of the true GPS signal. Third, is the notion of calibration. By introducing a signal processing component into the signal path, the code tracking loop settles in at an offset. This offset can be estimated theoretically in terms of the offset at which the discriminant is zero. However, the theoretical analysis cannot take into account all the "non-ideal" effects of components and so on. Thus, we calibrate the receiver to see, for a particular design, what the correction term needs to be. Fourth, the method is appropriate as an "add-on" so that existing GPS chip-sets can take advantage of the anti-jamming scheme.

CW Detection and Removal Configuration

Figure 5:
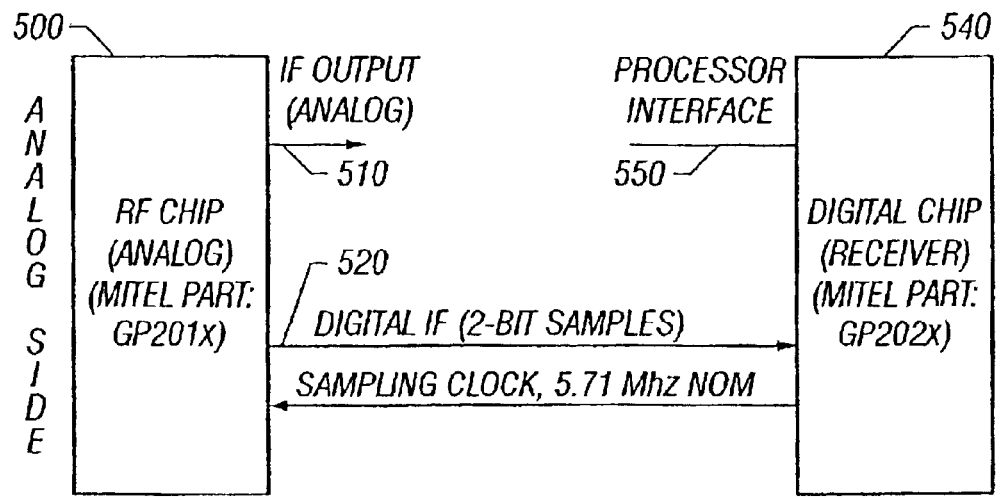
FIG. 5 illustrates a schematic block diagram of conventional GPS chip-set interconnections (signal), approximately labeled "Prior Art."

For purposes of specificity, we shall consider the Mitel GPS chip-set. Variations to accommodate other chip-sets are straightforward. The arrangement in FIG. 5 indicates how the Mitel chip-set is deployed. For clarity, only the signal lines that are of interest have been shown. The "RF chip" 500 handles the analog section including the down-conversion. The RF (radio frequency) chip 500 provides as one output 510 the actual "baseband" IF (intermediate frequency) analog signal as well as a second output 520 which is the output of an ADC that converts the baseband IF analog signal to digital. The ADC is built into the RF chip 500. In conventional designs the digital output of the ADC is connected from the RF chip to the digital chip 540 and the analog output is either left floating or properly terminated to avoid reflections or extraneous signal injection. The digital chip 540 contains the bulk of the receiver including the correlators and processor. In FIG. 5 we indicate that the processor can interface with external peripherals via the "processor interface" 550.

Figure 6:
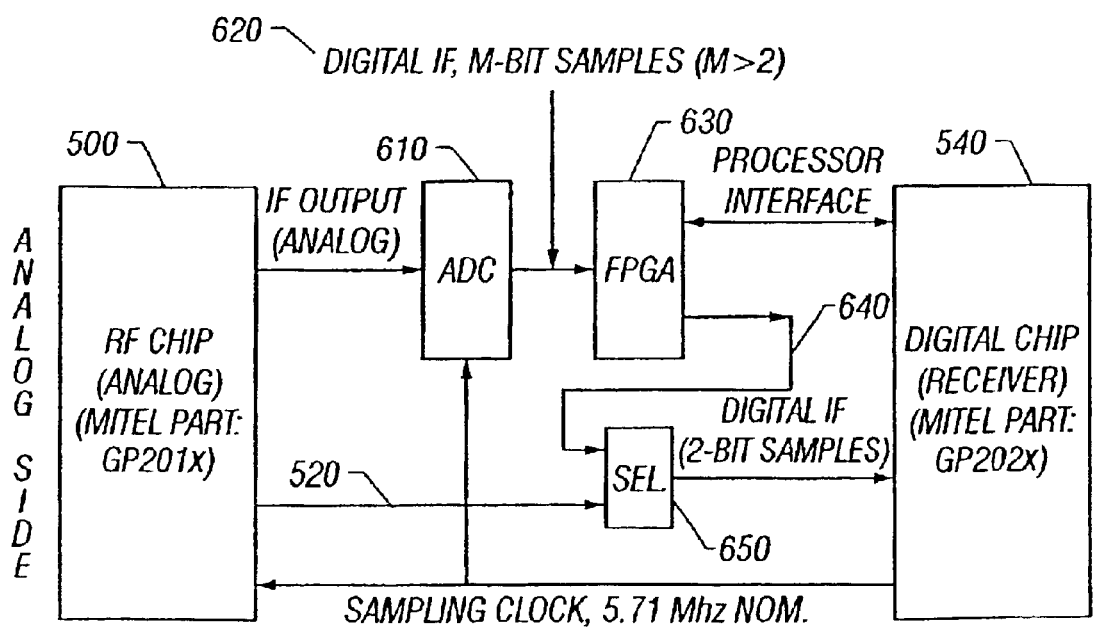
FIG. 6 illustrates a schematic block diagram of a configuration for providing an anti-jamming feature, representing an embodiment of the invention.

To implement the anti-jamming feature, an analog-to-digital converter 610 that provides a quantization level in excess of 2 bits can be used. The (high-precision) ADC output 620 is fed to the device that implements the digital filters associated with the anti-jamming feature. In the current implementation this is achieved using an FPGA (Field Programmable Gate Array) 630 that operates as a peripheral under control of the receiver processor located within the digital chip 540. The interconnection is depicted in FIG. 6 (again not all signal lines are shown). The interconnection includes an output 640 from the FPGA (Field Programmable Gate Array) 630. A selector 650 can be coupled between the digital chip and the FPGA 630. Clearly the additional circuitry can be provided in a manner that the digital chip 540 can accept the digital IF from either the RF chip 500 or the FPGA 630. Consequently the anti-jamming feature can be incorporated and left unused if it is known that there is no CW interference present.

Detection and Removal of CW Interference

Within the FPGA digital notch filters are implemented which position transmission zeros at the precise frequency at which we have CW interference. This is the means by which the interference is removed.

Figure 7:
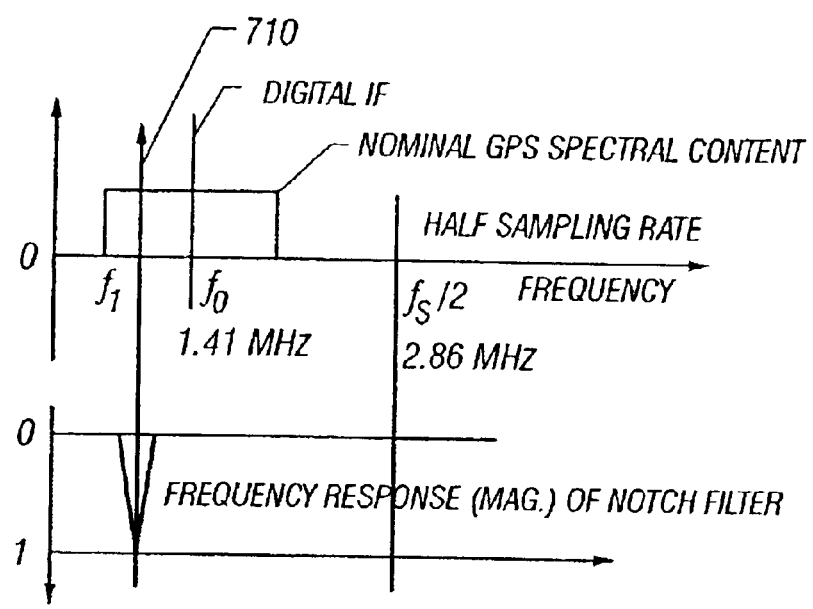
FIG. 7 illustrates positioning of a notch filter response to eliminate continuous wave interference, representing an embodiment of the invention.

In FIG. 7 we indicate the presence of a CW interfering signal 710 present in the Digital IF (output of the ADC). The CW (continuous wave) interfering signal is located at $f_1$. The frequency range shown is between 0 (dc) and 0.5 $f_s$ where $f_s$ is the sampling rate used to generate the digital IF signal. The GPS spectrum has a nominal width of approximately 1 MHz and is centered at a "digital IF" of $f_o$. In keeping with normal digital signal processing concepts, the frequency range depicted is adequate to completely describe the situation since the signals are all real-valued. In the Mitel chip-set implementation the sampling frequency is (40/7) MHz, or approximately 5.71 MHz. The analog down-conversion centers the signal at (approximately) 4.3 MHz and because of the inherent aliasing associated with sampling, the digital IF (i.e., $f_o$) is approximately 1.41 MHz.

From the theory of digital filter design (see, for example, Ref. [4]) we can achieve the requisite notch filter characteristic with a digital filter that has a transfer function of zero at the desired notch frequency and a corresponding transfer function pole close to the zero. For example, the following second order section (unsealed) will provide the requisite behavior.

$$H(z) = \frac{1 - 2\cos(\theta) \cdot z^{-1} + z^{-2}}{1 - 2 \cdot r \cdot \cos(\theta) \cdot z^{-1} + r^2 \cdot z^{-2}}$$

where r is close to 1, typically 0.9, and $$f_1 = \frac{\theta}{2\pi} \cdot f_s = \text{frequency of notch} \quad (3.2.1)$$

Digital Filters for Jamming Identification and Cancellation

This filter was selected to have the minimum possible number of numerical operations (additions, multiplications) and the divisions for scaling to be implemented as shifts. To eliminate a narrow-band jamming signal the invention can use a notch filter. To determine the intensity and frequency of the jamming signal the invention can use a band pass filter.

Clearly, it should be possible to change the center frequency of the band pass filter over the entire digital IF frequency range plus a guard band. In order to be able to compare signal levels at different frequencies, the band pass filter gain should be independent of its center frequency. The band pass filter bandwidth was chosen to be a small fraction of the GPS signal bandwidth; we found 50 KHz to be adequate. A reasonable tuning range is from 100 KHz to 2.8 MHz (100 KHz is twice the band pass filter bandwidth and 2.8 MHz is approximately half of the sampling frequency, which is equal to 40 MHz/7).

The Notch Filter

In order to introduce a zero in the frequency response we must have at least a pair of conjugate zeros on the unit circle in the z plane. This sets the numerator of the filter to a second-degree polynomial in z of the form:

$$N_{zero}(z) = z^2 + a_1 \cdot z + 1 \quad (3.2.2)$$

Figure 8:
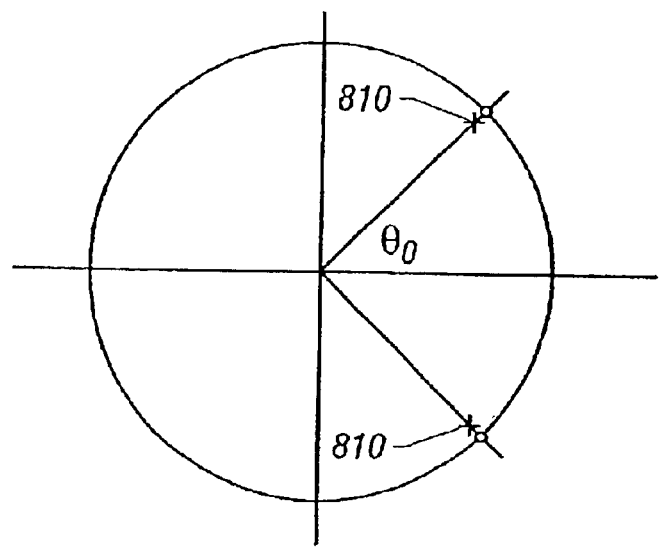
FIG. 8 illustrates a notch filter pole/zero configuration in the Z plane, representing an embodiment of the invention.

Referring to FIG. 8, an easy way to control the notch filter bandwidth is to introduce two poles 810 close to the zeros and inside the unit circle for a stable filter. Then the denominator of the filter is also a second-degree polynomial in z of the form:

$$D(z) = z^2 + c_1 \cdot z + c_2 \quad (3.2.3)$$

where $0 < c_2 < 1$ and it determines the bandwidth of the notch filter.

The notch filter transfer function is given by:

$$N(z) = \frac{z^2 + a_{1N} \cdot z + 1}{z^2 - b_{1N} \cdot z - b_{2N}} = \frac{1 - 2\cos(\theta_0) \cdot z^{-1} + z^{-2}}{1 - 2\gamma\cos(\theta_0) \cdot z^{-1} + \gamma^2 \cdot z^{-2}} \quad (3.2.4)$$

The angular frequency, $\omega$, and z are related by:

$$z = e^{j\omega T_s} = e^{j\theta} \quad (3.2.5)$$

where $T_s$ is the sampling period.

With $f_1$ the notch filter center frequency, $f_B$ the notch filter 3 dB bandwidth and $f_s(f_s = 1/T_s)$ the sampling frequency, the notch filter coefficients are given by:

$$\theta_0 = 2\pi \cdot \frac{f_1}{f_s} \quad a_{1N} = -2 \cdot \cos(\theta_0) \quad (3.2.6)$$

$$\gamma = 1 - \pi \cdot \frac{f_B}{f_s} \quad b_{1N} = 2 \cdot \gamma \cdot \cos(\theta_0)$$

$$b_{2N} = -\gamma^2$$

The corresponding difference equation relating the filter input $x(nT_S)$ and filter output $y(nT_S)$ is:

$$y_n = b_{1N} \cdot y_{n-1} + b_{2N} \cdot y_{n-2} + x_n + a_{1N} \cdot x_{n-1} + x_{n-2} \quad (3.2.7)$$

Where $y_n = y(nT_S)$ and $x_n = x(nT_S)$.

Figure 9:
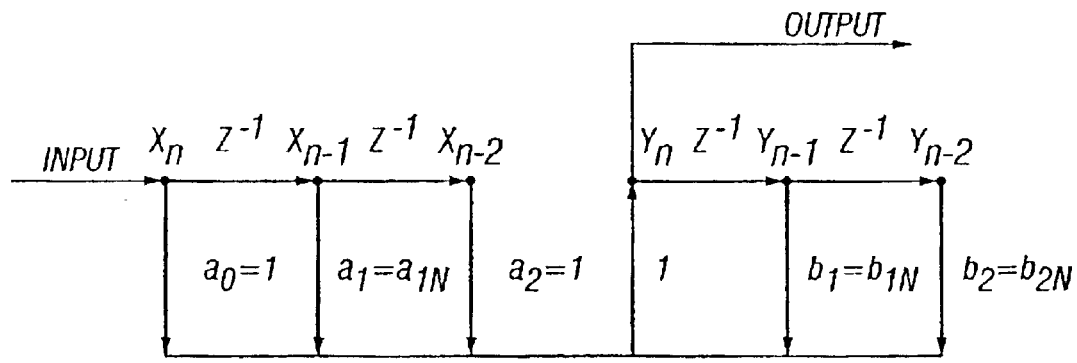
FIG. 9 illustrates a flow diagram depicting implementation of a notch filter, representing an embodiment of the invention.

The flow diagram depicted in FIG. 9 shows one possible implementation of the filter defined by the equation above. In FIG. 9, $z^{-1}$ represents a time delay of one sampling period and $a_0 = 1$; $a_1 = a_{1N}$; $a_2 = 1$; $b_1 = b_{1N}$; $b_2 = b_{2N}$. Thus, signal transformation by the notch filter can result in an output $y_n$ that is substantially unchanged, except at approximately the notch filter center frequency $f_1$ where the signal strength can be substantially zero.

To compute the output $y_n$, we need the input $x_n$ and the previous values $x_{n-1}$, $x_{n-2}$, $y_{n-1}$, $y_{n-2}$ that must be stored. Every time the filter coefficients are changed it is a good idea to initialize the stored values to zero.

The Band Pass Filter

Figure 10A:
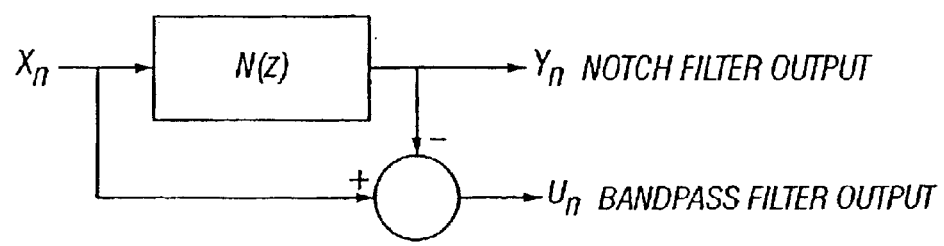
FIG. 10A illustrates a schematic block diagram of an implementation of a bandpass filter, representing an embodiment of the invention.

Referring to FIG. 10A, the band pass filter can be implemented by subtracting the output $y_n$ of the notch filter N(z) from its input $x_n$ as in an operation 1010 to obtain the band pass filter output $u_n$. Thus, a band pass filter output can be obtained that is, within the defined upper and lower frequency limits, substantially the same as the input, except at approximately the notch filter center frequency $f_1$ where the signal strength can be substantially zero. The output $u_n$ contains the useful part of $x_n$ where the (narrow-band) interference has been substantially removed. The output $y_n$ contains only the (narrow-band) interfering signal.

The filter from $x_n$ to $u_n$ will be a band pass with same center frequency and bandwidth as the notch-filter from $x_n$ to $y_n$.

The band pass filter transfer function is given by:

$$B(z) = 1 - N(z) = \frac{a_{1B} \cdot z^{-1} + a_{2B} \cdot z^{-2}}{1 - b_{1B} \cdot z^{-1} - b_{2B} \cdot z^{-2}} \quad (3.2.8)$$

With $f_o$ the band pass filter center frequency, $f_B$ the band pass filter 3 dB bandwidth and $f_s (f_s=1/T)$ the sampling frequency, the band pass filter coefficients are given by:

$$\theta_0 = 2\pi \cdot \frac{f_0}{F_s} \quad a_{1B} = 2 \cdot (1-\gamma) \cdot \cos(\theta_0) \quad (3.2.9)$$
$$\gamma = 1 - \pi \cdot \frac{f_B}{f_s} \quad a_{2B} = \gamma^2 - 1$$
$$b_{1B} = 2 \cdot \gamma \cdot \cos(\theta_0)$$
$$b_{2B} = -\gamma^2$$

Figure 10B:
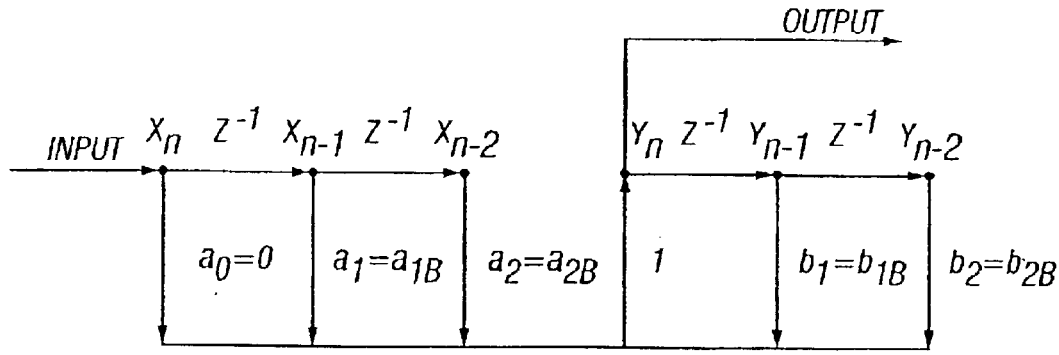
FIG. 10B illustrates a signal flow graph for the bandpass filter shown in FIG. 10A.

Both the band pass and the notch filters have the same general form, that is, the ratio of two second-degree polynomials in z. Referring to FIG. 10B, the same flow diagram used for the notch filter (see FIG. 9) can be used to implement the band pass filter by setting the coefficients as indicated below.

Where $z^{-1}$ represents a time delay of one sampling period and $a_0=0$; $a_1=a_{1B}$; $a_2=a_{2B}$; $b_1=b_{1B}$; $b_2=b_{2B}$. Note that since $a_0=0$ we could ignore the first delay and replace $x_{n-1}$ by $x_n$ and $x_{n-2}$ by $x_{n-1}$ saving one storage element.

Detection of a Jamming Signal

To detect the presence of a jamming signal the receiver-microprocessor tunes a band pass filter over the required frequency range in increments equal to, for example, approximately half of the band pass filter bandwidth (25 KHz). At each frequency increment, the band pass filter coefficients are computed and sent to the FPGA from the receiver processor.

Ideally we should compute the band pass filter output power at each frequency, but this would require the summation of the values squared of the band pass filter output. To avoid a multiplication (square), the sum of the absolute values of the filter output can be used instead. This procedure will also detect the concentration of energy at the center frequency of the band pass filter.

The band pass filters and the summation (about 1000 terms) of the absolute values of its output are implemented in the FPGA. Then samples of this sum are passed to the receiver-microprocessor where an average is computed and used as a measure of the "energy" level. This average is then analyzed as a function of frequency to search for peaks exceeding a preset threshold, which is determined by the noise level without a jamming signal. Finally using the band pass filter center frequency and the knowledge of the various local oscillator frequencies in the GPS receiver, the frequency of the jamming signal is established.

Filtering the Jamming Signal

To reduce the effect of a jamming signal, a notch filter is tuned to the jamming signal frequency at the digital IF frequency, which was determined by the detection process described above. The notch filter coefficients are computed by the receiver-microprocessor and sent to the FPGA, where the filter is implemented.

Generating the Output Digital Format (Version 1)

The output of the notch filter, computed by the FPGA, is sent to the receiver-microprocessor, which uses these values to compute a reference-level. The receiver-microprocessor sends this computed reference-level back to the FPGA. The FPGA uses this reference-level to map the output of the notch filter to Zero (0) or One (1) depending on if its absolute value is smaller or larger than the reference-level. To complete the operation, the FPGA sends the sign of the notch filter output and the resultant Zero (0) or One (1) to the correlator. That is, the digital output mimics the output of the RF chip.

The digital IF is the result of sampling the 4.309 MHz analog IF signal at a sampling rate of (40/7)MHz (see pages 10 and 11 of the Global Positioning Products Handbook GP2000 Designer's Guide, Ref [2]).

Number of Bits (Scaling for Finite Wordlength)

In practice the sampled signal and the filter coefficients have to be represented by a finite number of bits. For the notch filter to work properly (remove the jamming signal) we will need to use an ADC with 8 to 10 bits of precision to sample the 4.309 MHz analog IF signal.

By proper choice of coefficients the difference equation for both the notch filter and band pass filter equation can be written as:

$$1 \cdot y_n = b_1 \cdot y_{n-1} + b_2 \cdot y_{n-2} + a_0 \cdot x_n + a_1 \cdot x_{n-1} + a_2 \cdot x_{n-2} \quad (3.2.10)$$

This difference equation can be scaled so that the coefficients can be approximated by integers. Using K to represent the number of bits and considering that $-2 < b_2 < 2$ and that one bit is used for the sign then 1 is scaled as:

$$1 \longrightarrow S = 2^{K-2} \quad (3.2.11)$$

Scaling the difference equation we have:

$$S \cdot y_n = S \cdot b_1 \cdot y_{n-1} + S \cdot b_2 \cdot y_{n-2} + S \cdot a_0 \cdot x_n + S \cdot a_1 \cdot x_{n-1} + S \cdot a_2 \cdot x_{n-2} \quad (3.2.12)$$

Solving for $y_n$ we have:

$$y_n = \frac{B_1 \cdot y_{n-1} + B_2 \cdot y_{n-2} + A_0 \cdot x_n + A_1 \cdot x_{n-1} + A_2 \cdot x_{n-2}}{S} \quad (3.2.13)$$

The division by S can be implemented by a shift since S is a power of two.

Next we have to approximate the filter coefficients by their nearest integers (round as indicated below).

Using the formulas below the receiver-microprocessor computes the filter coefficients and sends them to the FPGA.

Band pass filter:

$$\theta_0 = 2\pi \cdot \frac{f_0}{f_s} \quad a_{1B} = 2 \cdot (1-\gamma) \cdot \cos(\theta_0)$$
$$\gamma = 1 - \pi \cdot \frac{f_B}{f_s} \quad a_{2B} = \gamma^2 - 1$$
$$b_{1B} = 2 \cdot \gamma \cdot \cos(\theta_0)$$
$$b_{2B} = -\gamma^2$$

$$S = 2^{K-1}$$

$$B_{1b} = \text{Round}(S \cdot b_{1B}) = INT(S \cdot b_{1B} + 0.5)$$

$$B_{2b} = \text{Round}(S \cdot b_{2B}) = INT(S \cdot b_{2B} + 0.5)$$

$$A_{0b} = 0$$

$$A_{1b} = \text{Round}(S \cdot a_{1b}) = INT(S \cdot a_{1B} + 0.5)$$

$$A_{2b} = -(B_{2B} + S)(\text{preserve } A_{2b} + B_{2b} = -S) \quad (3.2.14)$$

Notch filter (same frequency parameters as the band pass filter):

$$B_{1N}=B_{1B}$$

$$B_{2N}=B_{2B}$$

$$A_{0N}=S$$

$$A_{1N}=-(A_{1B}+B_{1B})$$

$$A_{2N}=S \quad (3.2.15)$$

Generating the Output Digital Format (Version 2)

In describing generating the output digital format (Version 1), we described one method for converting the multi-bit signal in the digital filters to the 2-bit format that the correlators in the digital chip require. This previously described method was adaptive in the sense that the processor could set the thresholds, but otherwise that previously described method could be considered "brute-force" and quite direct. The wordlength reduction to 2-bits introduces quite a large quantization noise power.

In this section we describe a method based on Delta-Sigma-Modulation or $\Delta\Sigma M$ (See Ref. [4], Chapter 8). $\Delta\Sigma M$ is a technique that shapes the quantization noise power such that the noise spectrum is low where the desired signal has most of its power.

Figure 11A:
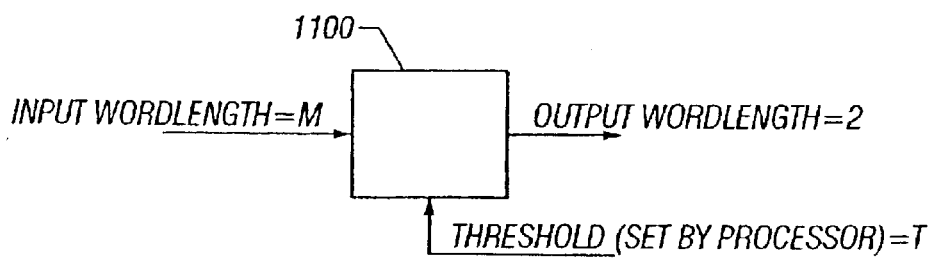
FIGS. 11A illustrates a schematic block diagram of a quantizer (word length reduction), representing an embodiment of the invention.
Figure 11B:
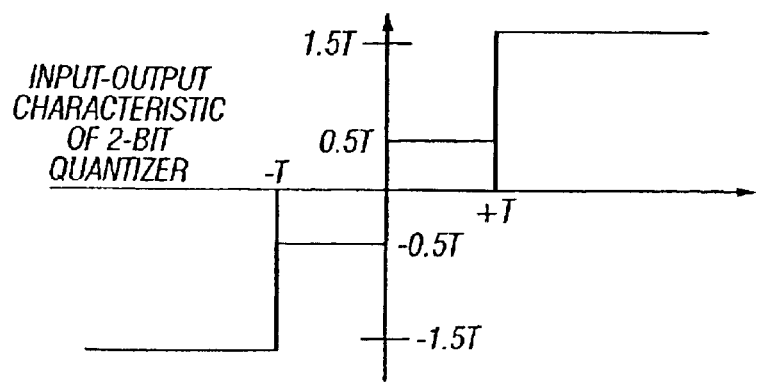
FIG. 11B illustrates the input-output characteristic associated with the quantizer depicted in FIG. 11A.

The rudimentary form of word-length reduction implied in describing generating the output digital format (Version 1) is depicted in FIGS. 11A and 11B. The action of the quantizer 1100 is simply to reduce the wordlength from M bits, representative of the wordlength used in the implementation of the digital filters, to 2-bits as required by the correlators in the digital chip. This is achieved by first deciding the sign (+ or −) and second deciding whether the magnitude is greater than a threshold, T (the threshold for the conversion must not be confused with the threshold for detection). The numerical values associated with the 2-bit code are ±0.5T and ±1.5T. The receiver processor assigns the threshold T based on the strength of the signal to achieve an adaptive quantizer behavior. A rough algorithm is to adjust the threshold T such that about ⅓ of the samples (approximately) correspond to ±1.5T.

Figure 12:
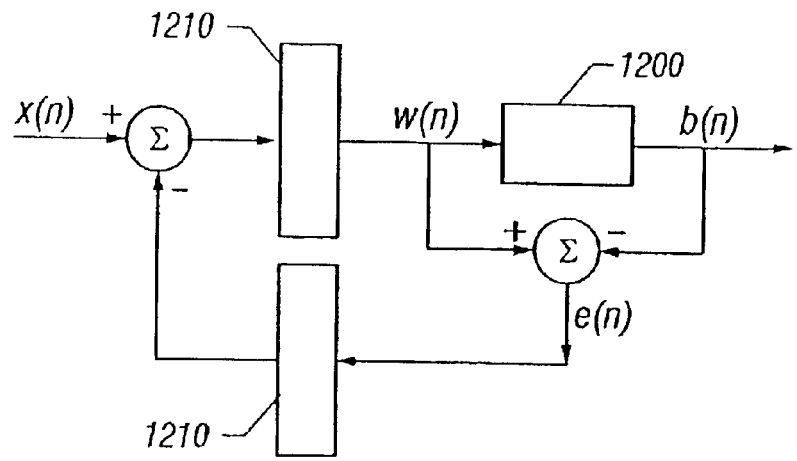
FIG. 12 illustrates a schematic block diagram of a $\Delta\Sigma M$ configuration for wordlength reduction, representing an embodiment of the invention.

This form of quantization can be modeled as the addition of "white noise" (this is the common assumption used when dealing with quantizers) and thus the quantization noise power is uniformly distributed over frequency. Using $\Delta\Sigma M$ techniques we can shape the quantization noise power spectrum to be small within the spectral region of the GPS signal, albeit large outside the signal bandwidth. The effective filtering action of the correlator can reduce the out-of-band noise but cannot really affect in-band noise. Consequently this spectral shaping provides enhanced performance. The $\Delta\Sigma M$ structure is depicted in FIG. 12.

The action of the $\Delta\Sigma M$ is to establish the error made when a sample value is quantized and feed this error back to influence subsequent samples. By embedding a quantizer 1200 in a feedback loop in this manner we achieve the result of error spectrum shaping. The notion of a register 1210 in FIG. 12 is to store intermediate signals. The register 1210 contents during the interval $nT_s$ through $(n+1)T_s$, namely one cycle of the sampling clock are associated with the value of the sample at the n-th sampling epoch. With this in mind, the following equations define the operation of the $\Delta\Sigma M$ structure in FIG. 12.

$$e(n)=w(n)-b(n)$$

$$b(n)=Q[w(n)]$$

$$w(n+1)=x(n)-e(n-1) \quad (3.2.16)$$

Eq. (3.2.16) can be, with some algebra, reduced to $$b(n+1)=x(n)+(e(n+1)+e(n-1)) \quad (3.2.17)$$

which implies that the structure introduces a one-sample delay and the quantization noise, e(n), appears in the output as though it had been filtered by a first order all-zero transfer function given by $$H_e(z)=1+z^{-2} \quad (3.2.16)$$

From this we can tell that the quantization noise power has increased by a factor of two (3 dB) but the error spectrum has a zero at ($f_s/4$). For the Digital IF signal, the sampling rate is 5.714 MHz and the center frequency of the GPS component is 1.405 MHz, roughly one-fourth the sampling frequency.

Consequently this scheme provides for improvement in signal-to-inband-quantization noise. In particular, (see Ref [4]) we can estimate the improvement as 8.7 dB. That is, even though the total quantization noise power is increased by a factor of 2, a small fraction (0.0668) lies within the range 1.405±0.5 MHz which is the nominal bandwidth of the GPS signal.

Estimate of Timing Offset Caused by 1 Notch

In the previous discussion of the code tracking loop we indicated that if there was a deviation from "ideal" in the transmission path, the discriminant, D, would be zero at an offset as opposed to perfect code-phase alignment. The actual timing offset observed would be less than this theoretical offset. The theoretical offset can indeed be estimated and a computer program to do just that was generated. The results are shown in the Table below. The calculations assume that there is one notch filter. The frequency of this notch is varied over the range of from 500 kHz below to 500 kHz above the nominal center frequency (which we refer to as L1). The offset for each of the 32 possible Gold codes was computed and we provide the average and standard deviation over these 32 possibilities for each notch frequency. The time units are nanoseconds.

(Average is over 32 SVs; variance=square of standard-dev. over 32 SVs)

| Notch Freq. (kHz from L1) | Offset (Average) | Offset (Variance) |
|---|---|---|
| −.5000E+03 | −.4303E+02 | .7803E+00 |
| −.4900E+03 | −.4144E+02 | .2996E+01 |
| −.4800E+03 | −.3953E+02 | .6249E+01 |
| −.4700E+03 | −.3741E+02 | .1043E+02 |
| −.4600E+03 | −.3503E+02 | .1547E+02 |
| −.4500E+03 | −.3253E+02 | .2025E+02 |
| −.4400E+03 | −.2966E+02 | .2541E+02 |
| −.4300E+03 | −.2663E+02 | .3273E+02 |
| −.4200E+03 | −.2344E+02 | .3643E+02 |
| −.4100E+03 | −.2003E+02 | .4091E+02 |
| −.4000E+03 | −.1634E+02 | .4410E+02 |
| −.3900E+03 | −.1256E+02 | .4675E+02 |
| −.3800E+03 | −.8594E+01 | .4918E+02 |
| −.3700E+03 | −.4438E+01 | .4993E+02 |
| −.3600E+03 | −.3125E−01 | .5172E+02 |
| −.3500E+03 | .4563E+01 | .5056E+02 |
| −.3400E+03 | .9313E+01 | .5046E+02 |
| −.3300E+03 | .1416E+02 | .4969E+02 |

-continued

| Notch Freq. (kHz from L1) | Offset (Average) | Offset (Variance) |
|---|---|---|
| −.3200E+03 | .1906E+02 | .4731E+02 |
| −.3100E+03 | .2416E+02 | .4488E+02 |
| −.3000E+03 | .2919E+02 | .4053E+02 |
| −.2900E+03 | .3438E+02 | .3692E+02 |
| −.2800E+03 | .3953E+02 | .3450E+02 |
| −.2700E+03 | .4463E+02 | .3086E+02 |
| −.2600E+03 | .4963E+02 | .2705E+02 |
| −.2500E+03 | .5444E+02 | .2531E+02 |
| −.2400E+03 | .5916E+02 | .2213E+02 |
| −.2300E+03 | .6372E+02 | .2020E+02 |
| −.2200E+03 | .6831E+02 | .1834E+02 |
| −.2100E+03 | .7269E+02 | .1728E+02 |
| −.2000E+03 | .7694E+02 | .1775E+02 |
| −.1900E+03 | .8106E+02 | .1706E+02 |
| −.1800E+03 | .8500E+02 | .1681E+02 |
| −.1700E+03 | .8888E+02 | .1442E+02 |
| −.1600E+03 | .9241E+02 | .1343E+02 |
| −.1500E+03 | .9588E+02 | .1192E+02 |
| −.1400E+03 | .9909E+02 | .1052E+02 |
| −.1300E+03 | .1020E+03 | .9843E+01 |
| −.1200E+03 | .1047E+03 | .9663E+01 |
| −.1100E+03 | .1069E+03 | .1075E+02 |
| −.1000E+03 | .1090E+03 | .1091E+02 |
| −.9000E+03 | .1107E+03 | .1128E+02 |
| −.8000E+03 | .1123E+03 | .1215E+02 |
| −.7000E+03 | .1134E+03 | .1237E+02 |
| −.6000E+03 | .1145E+03 | .1281E+02 |
| −.5000E+03 | .1154E+03 | .1242E+02 |
| −.4000E+03 | .1160E+03 | .1241E+02 |
| −.3000E+03 | .1165E+03 | .1262E+02 |
| −.2000E+03 | .1169E+03 | .1268E+02 |
| −.1000E+03 | .1171E+03 | .1165E+02 |
| .0000E+00 | .1172E+03 | .1171E+02 |
| .1000E+03 | .1171E+03 | .1165E+02 |
| .2000E+03 | .1169E+03 | .1268E+02 |
| .3000E+03 | .1165E+03 | .1262E+02 |
| .4000E+03 | .1160E+03 | .1241E+02 |
| .5000E+03 | .1154E+03 | .1242E+02 |
| .6000E+03 | .1145E+03 | .1281E+02 |
| .7000E+03 | .1134E+03 | .1237E+02 |
| .8000E+03 | .1123E+03 | .1215E+02 |
| .9000E+03 | .1107E+03 | .1128E+02 |
| .1000E+03 | .1090E+03 | .1091E+02 |
| .1100E+03 | .1069E+03 | .1075E+02 |
| .1200E+03 | .1047E+03 | .9663E+01 |
| .1300E+03 | .1020E+03 | .9843E+01 |
| .1400E+03 | .9909E+02 | .1052E+02 |
| .1500E+03 | .9588E+02 | .1192E+02 |
| .1600E+03 | .9241E+02 | .1343E+02 |
| .1700E+03 | .8888E+02 | .1442E+02 |
| .1800E+03 | .8500E+02 | .1681E+02 |
| .1900E+03 | .8106E+02 | .1706E+02 |
| .2000E+03 | .7694E+02 | .1775E+02 |
| .2100E+03 | .7269E+02 | .1728E+02 |
| .2200E+03 | .6831E+02 | .1834E+02 |
| .2300E+03 | .6372E+02 | .2020E+02 |
| .2400E+03 | .5916E+02 | .2213E+02 |
| .2500E+03 | .5444E+02 | .2531E+02 |
| .2600E+03 | .4963E+02 | .2705E+02 |
| .2700E+03 | .4463E+02 | .3086E+02 |
| .2800E+03 | .3953E+02 | .3450E+02 |
| .2900E+03 | .3438E+02 | .3692E+02 |
| .3000E+03 | .2919E+02 | .4053E+02 |
| .3100E+03 | .2416E+02 | .4488E+02 |
| .3200E+03 | .1906E+02 | .4731E+02 |
| .3300E+03 | .1416E+02 | .4969E+02 |
| .3400E+03 | .9313E+01 | .5046E+02 |
| .3500E+03 | .4563E+01 | .5056E+02 |
| .3600E+03 | −.3125E+01 | .5172E+02 |
| .3700E+03 | −.4438E+01 | .4993E+02 |
| .3800E+03 | −.8594E+01 | .4918E+02 |
| .3900E+03 | −.1256E+02 | .4675E+02 |
| .4000E+03 | −.1634E+02 | .4410E+02 |
| .4100E+03 | −.2003E+02 | .4091E+02 |
| .4200E+03 | −.2344E+02 | .3643E+03 |
| .4300E+03 | −.2663E+02 | .3273E+02 |
| .4400E+03 | −.2966E+02 | .2541E+02 |
| .4500E+03 | −.3253E+02 | .2025E+02 |
| .4600E+03 | −.3503E+02 | .1547E+02 |
| .4700E+03 | −.3741E+02 | .1043E+02 |
| .4800E+03 | −.3953E+02 | .6249E+01 |
| .4900E+03 | −.4144E+02 | .2996E+01 |
| .5000E+03 | −.4304E+02 | .7803E+00 |

An Enhanced Correlator Scheme

Figure 13:
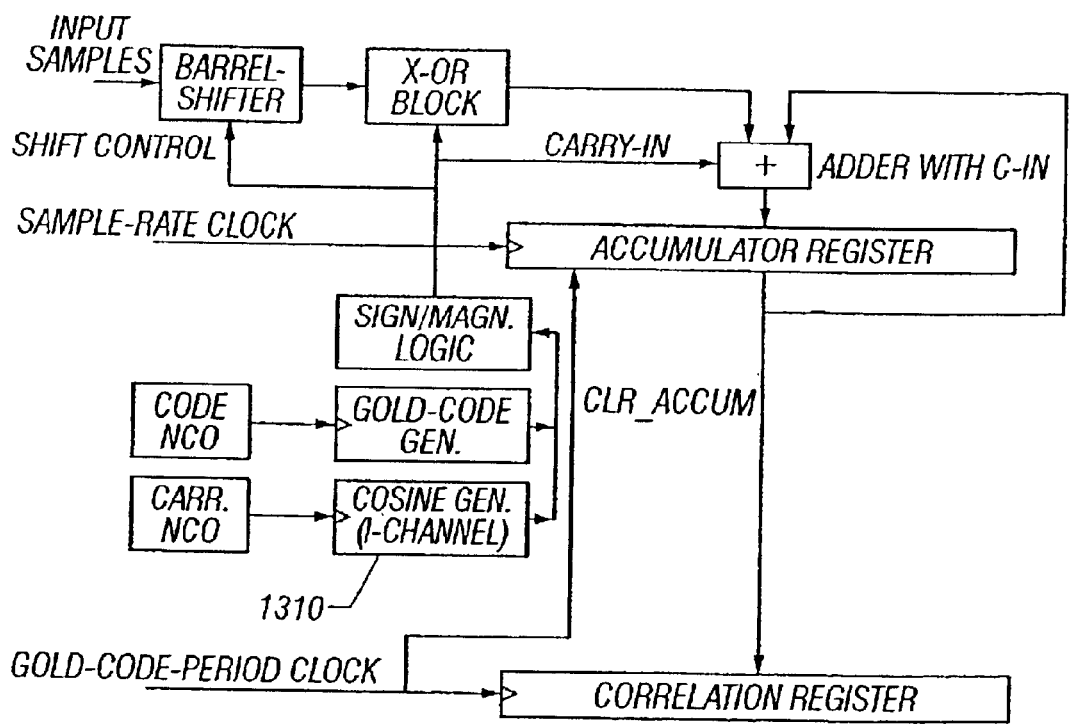
FIG. 13 illustrates a schematic block diagram of a multi-bit correlator architecture, representing an embodiment of the invention.

As mentioned before, most GPS chip-sets available today use ADCs that provide limited precision quantization, between 2 and 4 levels. As a consequence, part of the jamming elimination circuitry described above involved reduction of wordlength to that expected by the (original) design of the GPS chip-set correlator. It can be an advantageous to have an enhanced correlator, one that would accept a multi-bit (for example 8 or 10 bits) input directly. The architecture of such a multi-bit correlator is depicted in FIG. 13 which indicates just the "in-phase" part of the correlation operation. For the "quadrature" part of the correlation operation, the "cosine" generator 1310 can be replaced by a "sine" generator.

In most chip-sets, the final down-conversion is done digitally, multiplying the real-valued signal from the ADC by the complex carrier of frequency $f_0$ (see FIG. 7) to generate a complex signal wherein the nominal "carrier frequency" is zero (i.e., dc). In the Mitel implementations $f_0$ is approximately 1.41 MHz. To avoid the use of a full-blown digital multiplier, this complex carrier signal is quantized very coarsely, retaining just 1 or 1.5 or 2 bits for each of the cosine and sine parts of the signal. In the Mitel chip the sinusoids are quantized to 4 levels (effectively 2 bits) that, in a normalized sense, correspond to numerical values of ±1 and ±2.

Recognizing that the Gold-code values can be treated as ±1, and the quantized complex carrier can be treated as having values of ±1 and ±2 for the real (i.e., "in-phase") and imaginary (i.e., "quadrature") parts, the implied product of input signal samples with the carrier and the code can be implemented very simply as indicated in FIG. 13. In particular, the barrel shifter shifts by 0 bits or 1 bit to get a magnitude multiplication factor of 1 or 2. Assuming that the representation of numbers uses the 2-s-complement scheme, multiplication by −1 is easily accomplished by inverting all the bits as indicated by the "X-OR block" together with controlling the carry-in bit of the subsequent adder module. The "accumulate-and-dump" operation corresponding to the integration over one code-period is accomplished by the accumulator which is cleared at the start of the Gold-code period and the value at the end of the period is loaded into the "Correlation Register."

The use of a multi-bit correlator has two fundamental advantages. First, if the jamming is not severe, then the notch filters can be bypassed and the ADC values fed directly to the correlator. This reduces the, albeit small, deleterious impact of the notch filters altering the signal and we rely on the ability of the correlation procedure itself to mitigate the impact of the jamming signal. Second, if the jamming is severe enough to warrant the inclusion of the notch filters in the signal path, having the multi-bit correlator obviates the need to reduce the word-length of the filter outputs to 1 or 2 bits.

A System Viewpoint of Anti-Jamming

The approach to anti-jamming described herein has been two-pronged. First is the detection mechanism. Second is the removal mechanism. Both can be under software control. The invention can include a system called "GPS TRACS" which provides a graphical user interface ("GUI") so that an operator, or network management system, can obtain information on the performance of the GPS receiver in general. A special screen has been developed for observing and displaying the nature and impact of interference.

The detection mechanism is "always on." The center frequency of the band-pass filter is swept across the GPS band and thus we have a continually updated view of the interference situation. Two modes of operation are provided in the event that significant jamming power is detected at any particular frequency. These are the "manual" and "automatic" modes of operation. In the automatic mode, if a significant jammer is detected, a notch-filter is invoked to remove the interfering signal. In the manual mode, operator intervention is called for in order to invoke the instantiation of a notch filter, with the system determining the appropriate frequency.

The invention can also be included in a kit. The kit can include some, or all, of the components that compose the invention. The kit can be an in-the-field retrofit kit to improve existing systems that are capable of incorporating the invention. The kit can include software/firmware and/or hardware for carrying out the invention. The kit can also contain instructions for practicing the invention. The components, software, firmware, hardware and/or instructions of the kit can be the same as those used in the invention.

The term approximately, as used herein, is defined as at least close to a given value (e.g., preferably within 10% of, more preferably within 1% of, and most preferably within 0.1% of). The term substantially, as used herein, is defined as at least approaching a given state (e.g., preferably within 10% of, more preferably within 1% of and most preferably within 0.1% of). The term coupled, as used herein, is defined as connected, although not necessarily directly, and not necessarily mechanically. The term deploying, as used herein, is defined as designing, building, shipping, installing and/or operating. The term means, as used herein, is defined as hardware, firmware and/or software for achieving a result. The term program or programmable or programming, as used herein, is defined as a sequence of instructions designed for execution on a computer system. A sequence of instructions, may include a subroutine, a function, a procedure, an object method, an object implementation, an executable application, an applet, a servlet, a source code, an object code, a shared library/dynamic load library and/or other sequence of instructions designed for execution on a computer system. The terms including and/or having, as used herein, are defined as comprising (i.e., open language). The terms a or an, as used herein, are defined as one or more than one. The term another, as used herein, is defined as at least a second or more.

Advantages of the Invention

The invention can be cost effective and advantageous for at least the following reasons. The anti-jamming principle and methods described above can be summarized into the following key innovations:

The invention has application with existing chip-sets. The methods for detecting and eliminating jamming signals described here are appropriate for incorporation into GPS receivers using currently available chip-sets.

The invention permits CW detection and removal of jamming. The method is based on applying a digital band-pass filter, with programmable center frequency, so as to detect the presence and strength of jamming signals (if any). A notch filter, with programmable notch frequency, can be invoked to remove the jamming signal. Whereas the detection is an ongoing process, the notch filter remains in place until removed. The programming of frequency and insertion/removal of notch filter(s) is under software control.

The invention can include calibration. The insertion of a notch filter introduces a shift in the (time) position of the 1-PPS signal. We have shown the bounds of the maximum expected "error" and it is possible to calibrate the receiver to compensate for the "error."

The invention can include enhanced quantization. Existing chip-sets use correlators that expect the ADC word length to be 1 or 2 bits. As part of the signal processing chain in the (external to the chip-set) circuitry (i.e., in the FPGA) we include an enhanced quantizer of the $_{\Delta\Sigma M}$ type to reduce the impact of quantization noise. In particular, the quantization noise is shaped so that the majority of the quantization noise power lies outside the bandwidth occupied by the Gold-code signal of GPS.

The invention can include an enhanced correlator. For future designs of GPS correlators, we have described a multi-bit correlator architecture. This would obviate the need for the coarse quantization of the notch filter output and, further, if the jamming power is small, the multi-bit correlator by itself would provide the jamming immunity.

The invention can include system operation in an automatic mode. As part of the control software, the notion of automatic versus manual introduction of notch filters provides a valuable tool for the system designer. If the GPS receiver must operate in an autonomous manner, with little intervention by an operator, the automatic mode is appropriate. By allowing a manual mode, the operator is provided flexibility regarding the provisioning of the notch filters.

All the disclosed embodiments of the invention disclosed herein can be made and used without undue experimentation in light of the disclosure. Although the best mode of carrying out the invention contemplated by the inventor(s) is disclosed, practice of the invention is not limited thereto. Accordingly, it will be appreciated by those skilled in the art that the invention may be practiced otherwise than as specifically described herein.

Further, the individual components need not be combined in the disclosed configurations, but could be combined in virtually any configuration. Further, variation may be made in the steps or in the sequence of steps composing methods described herein.

Further, although the GPS receiver described herein can be a separate module, it will be manifest that the GPS receiver may be integrated into the system with which it is (they are) associated. Furthermore, all the disclosed elements and features of each disclosed embodiment can be combined with, or substituted for, the disclosed elements and features of every other disclosed embodiment except where such elements or features are mutually exclusive.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

References

[1] Understanding GPS Principles and Applications, Elliott D. Kaplan (Ed.), Artech House Publishers, Boston/London, 1996. ISBN: 0-89006-793-7.

[2] GEC Plessey Semiconductors, *Global Positioning Products Handbook*, August 1996.

[3] Frank Amoroso and Jacob Bricker, "Performance of the Adaptive A/D Converter in Combined CW and Gaussian Interference," *IEEE Transaction on Communications*, VOL. COM-34, No. 3, March 1986.

[4] Kishan Shenoi, Digital Signal Processing in Telecommunications, Prentice-Hall Inc, Upper Saddle River, N.J., 1995. ISBN: 0-13-096751-3.

[5] D. Moulin, M. N. Solomon, T. M. Hopkinson, P. T. Capozza, J. Psilos, "High-Performance RF-to-Digital Translators for GPS Anti-Jam Applications."

[6] R. L. Fante, J. J. Vaccaro, "Enhanced Anti-Jam Capability for GPS Receivers."

[7] M. Zhodzishsky, D. Chemiavsky, A. Kirsanov, M. Vorobiev, V. Prasolov, A. Zhdanov, J. Ashjaee, "In-Band Interference Suppression for GPS/GLONASS."

[8] S. V. Lyusin, L. B. Sazonov, I. G. Khazanov, A. S. Komarov, "Combined GPS/GLONASS Receiver with high Antijamming Performance."

[9] J. M. Lopez-Almansa, P. A. Pablos, "Measurement Error and Protection Envelopes in the Presence of Interference for GNSS Receivers."

[10] The Electrical Engineering Handbook, CRC Press, (Richard C. Dorf et al. eds., 1993).

What is claimed is:

1. A method, comprising detecting an interfering signal including:
   tuning a band pass filter over a frequency range; and
   at each of a plurality of incremental frequencies:
      computing a set of band pass filter coefficients;
      sending said set of band pass filter coefficients to a digital filter;
      repeatedly transforming an analog-to-digital converter output having a quantization level in excess of 2 bits into a band pass filter output with said digital filter to obtain a plurality of samples;
      computing an average of said plurality of samples; end comparing said average to a threshold to detect peaks that exceed a threshold.

2. The method of claim 1, wherein said digital filter is implemented using a field programmable gate array (FPGA) or application specific integrated circuit (ASIC).

3. The method of claim 1, wherein transforming includes computing a summation of absolute values of the band pass filter output that are a function of said band pass filter coefficients.

4. The method of claim 1, wherein transforming includes computing a summation of the squares of the band pass filter output that are a function of said band pass filter coefficients.

5. The method of claim 1, wherein tuning includes tuning the band pass filter in increments equal to approximately half of a band pass filter bandwidth.

6. The method of claim 1, wherein the quantization level is from 8 to 10 bits.

7. The method of claim 1, wherein the interfering signal includes continuous wave jamming.

8. The method of claim 1, further comprising computing a frequency of said interfering signal.

9. The method of claim 1, further comprising attenuating said interfering signal by a notch filter centered at said frequency of said interfering signal from an input $x_n$ to said notch filter to obtain an output $y_n$ from said notch filter that contains a useful portion of the input $x_n$.

10. The method of claim 9 wherein said interfering signal is substantially removed by the notch filter and resulting signal is used as an input to the digital part of a GPS receiver.

11. The method of claim 10, wherein a result of subtracting the intermediate output $u_n$ from the input $x_n$ is mapped to a 2-bit digital representation by assigning to each sample at the output of the notch filter:
   a magnitude bit of "1" (or "0") if the magnitude of the output of the notch filter is greater than a reference level; or
   a magnitude bit of "0" (or "1") if the magnitude of the notch filter not greater than said reference level; and
   a sign bit of "1" (or "0") if the polarity of the output of the notch filter is positive; or
   a sign bit of "0" (or "1") if the polarity of the output of the notch filter is negative.

12. The method of claim 10, wherein the output of the notch filter is transformed with a DSM circuit to provide an improvement with regard to in-band signal-to-noise.

13. The method of claim 10, wherein the output of the notch filter is provided to a multi-bit correlator as a multi-bit input.

14. The method of claim 13, wherein the multi-bit input to the multi-bit correlator includes from 8 to 10 bits.

15. The method of claim 10, further comprising calibrating a code phase alignment with a timing offset that is a function of a frequency of said notch filter.

16. A computer program, comprising computer or machine readable program elements translatable for implementing the method of claim 1.

17. A global positioning system (GPS) receiver including the method of claim 1.

18. An electronic media, comprising a program for performing the method of claim 1.

19. An apparatus, comprising the electronic media of claim 18.

20. A process of receiving a global positioning system signal, comprising utilizing the apparatus of claim 19.

21. An electronic media, comprising: a computer program having a sequence of instructions for detecting an interfering signal including: tuning a band pass filter over a frequency range; and at each of a plurality of incremental frequencies: computing a set of band pass filter coefficients; sending said set of band pass filter coefficients to a digital filter;
   repeatedly transforming an analog-to-digital converter output having a quantization level in excess of 2 bits into a band pass filter output with said digital filter to obtain a plurality of samples; computing an average of said plurality of samples; and comparing said average to a threshold to detect peaks that exceed a threshold.

22. An apparatus, comprising the electronic media of claim 21.

23. A method, comprising deploying the electronic media of claim 21.

24. The electronic media of claim 21, wherein the quantization level is from 8 to 10 bits.

25. A computer program comprising computer program means adapted to perform the steps of detecting an interfering signal including: tuning a band pass filter over a frequency range; and at each of a plurality of incremental frequencies: computing a set of band pass filter coefficients; sending said set of band pass filter coefficients to a digital filter; repeatedly transforming an analog-to-digital converter output having a quantization level in excess of 2 bits into a band pass filter output with said digital filter to obtain a plurality of samples; computing an average of said plurality of samples; and comparing said average to a threshold to detect peaks that exceed a threshold when said program is run on a computer.

26. A computer program as claimed in claim 25, embodied on a computer-readable medium.

27. The computer program of claim 25, wherein the quantization level is from 8 to 10 bits.

* * * * *